United States Patent [19]

Sullivan

[11] Patent Number: 4,706,167
[45] Date of Patent: * Nov. 10, 1987

[54] CIRCUIT WIRING DISPOSED ON SOLDER MASK COATING

[75] Inventor: Donald F. Sullivan, 56 W. White Oak Rd., Paradise, Pa. 17562

[73] Assignee: Telemark Co., Inc., Gap, Pa.

[*] Notice: The portion of the term of this patent subsequent to Jul. 9, 2002 has been disclaimed.

[21] Appl. No.: 809,767

[22] Filed: Dec. 17, 1985

Related U.S. Application Data

[63] Continuation-in-part of Ser. No. 681,686, Dec. 14, 1984, which is a continuation-in-part of Ser. No. 550,379, Nov. 10, 1983, Pat. No. 4,528,259.

[51] Int. Cl.[4] .............................................. H05K 1/11
[52] U.S. Cl. ...................................... 361/406; 29/847; 174/68.5; 361/404; 427/96; 430/313
[58] Field of Search ............... 174/68.5; 361/398, 402, 361/406.8, 404, 411; 427/96; 430/315, 319, 312, 313; 324/73 PC; 29/847

[56] References Cited

U.S. PATENT DOCUMENTS

| | | | |
|---|---|---|---|
| Re. 28,506 | 8/1975 | Quaintance et al. | 427/96 X |
| 3,243,498 | 3/1966 | Allen et al. | 174/68.5 |
| 3,400,210 | 9/1968 | Reimer | 361/414 X |
| 3,434,208 | 3/1969 | Toomey et al. | 427/96 X |
| 3,922,479 | 11/1975 | Older et al. | 430/312 X |
| 4,056,773 | 11/1977 | Sullivan | 324/73 PC |
| 4,285,780 | 8/1981 | Schachter | 427/96 X |
| 4,343,877 | 8/1982 | Chiang | 430/312 X |
| 4,489,146 | 12/1984 | Bock et al. | 430/315 X |
| 4,528,259 | 7/1985 | Sullivan | 430/315 X |
| 4,572,764 | 2/1986 | Fan | 427/96 X |
| 4,604,799 | 8/1986 | Gurol | 178/68.5 X |
| 4,617,253 | 10/1986 | Taylor et al. | 430/313 X |

FOREIGN PATENT DOCUMENTS

| | | | |
|---|---|---|---|
| 2633175 | 1/1978 | Fed. Rep. of Germany | 324/73 PC |
| 53-64484 | 6/1978 | Japan | 430/315 |

Primary Examiner—Arthur T. Grimley
Assistant Examiner—Jane K. Lau
Attorney, Agent, or Firm—Laurence R. Brown

[57] ABSTRACT

In the manufacturing process for a printed wiring board a photopolymer insulation layer having a flat outer plateau surface is extended from the board substrate surface carrying the wiring pattern and provides access channels to a plurality of wiring pattern conductor pad areas. A patterned conductor layer disposed on the insulation layer surface including the sidewalls of the access channels thus electrically connects to the conductor pad areas. Circuit wiring pattern test current or plating currents are passed through the conductor layer pattern during the manufacturing process, and the conductor layer may thereafter be easily removed from the flat surface by sanding or the like. Permanently retained conductor layer portions, such as feasible by indenting the plateau surface, aid in expanding conductor surface areas at solder joint pads, or in increasing the density of circuit wires feasible in a given substrate board area. The conductor layer may provide indicia marking nomenclature patterns which are in dot matrix format to reduce capacitance coupling between wiring circuits on the board substrate.

37 Claims, 10 Drawing Figures ial No. 681,686 filed Dec. 14, 1984 for HIGH
CIRCUIT WIRING DISPOSED ON SOLDER MASK COATING

BACKGROUND OF THE INVENTION

This invention is a continuation-in-part of my application Ser. No. 681,686 filed Dec. 14, 1984 for HIGH DENSITY WIRING, which in turn is a continuation-in-part of my copending application Ser. No. 550,379 filed Nov. 10, 1983 for PRINTED WIRING BOARDS WITH SOLDER MASK OVER BARE COPPER WIRES HAVING LARGE AREA THICKENED CIRCUIT PAD CONNECTIONS, now U.S. Pat. No. 4,528,259 of Jul. 9, 1985.

TECHNICAL FIELD

This invention relates to the manufacture of printed circuit wiring boards and more particularly it relates to more efficient use of printed wiring board substrate area resulting in increased wiring capacity by means of a circuit pattern carrying polymer solder mask coatings overlying the primary circuit wiring pattern.

The high resolution and high density circuit configurations of modern printed wiring board requirements present many unsolved manufacturing problem challenges. With high wiring densities, problems are presented including short circuiting between wires, open circuits, improper adherence of conductors to insulator substrate surfaces, undesired capacitance coupling between wires, insufficient conductor surface areas and thicknesses for producing the desired conductivity, difficulties in preparing soldered circuit connections, surface damage and scratching, undesired etching under wires, through hole connections, testing circuit boards in the manufacturing phase, and finding space and techniques for providing indicia markers on the boards. All of these challenges must be met with simple, economical manufacturing techniques. Furthermore, the manufacturing techniques need be adaptable commercially and technically to small batch runs of a few custom designed wiring boards, as well as high quantity production runs.

As wiring densities become greater, the problems magnify, since narrow conductors have little area to adhere to substrates and are likely to be undercut or fractured. Also, solder connections become critical because of the lack of space at circuit connector pads. Such boards may be quite expensive of themselves. Consequentially if failures show up in the field after boards are adapted, the damages are significantly multiplied. Thus, testing in the manufacturing phase becomes critical to assure absence of defects.

Conventionally in the printed circuit arts, a printed wiring pattern is formed on a thin metallic deposit or laminate on a flat insulating substrate body. Thus, the conductor lines are thin, generally copper, ribbons of a standardized thickness of about 0.0014 in. Several problems exist in making quality trouble free boards, including (1) adhesion problems between the insulating substrate and the copper ribbon conductor, (2) the conductivity of the conductor lines as the lines become small and the packing density great, and (3) the resolution of the patterning procedure for forming the lines, particularly where packing densities become high, which may cause short circuiting between two adjacent closely positioned lines. Thus, in high density wiring patterns, parallel conductors of about 0.005 in. width separated by insulation spaces on the substrate surface of about 0.005 in. are not easily manufactured. Thus, consider that etching processes in formulating the pattern are likely to undercut the copper ribbon and reduce adhesion area. Furthermore, it is difficult to assure adherance between the copper and the insulating substrate surface to the extent that there are no defect areas that could cause malfunctions with conductor line widths of .005 in. or less. Similarly, slight impurity centers in the deposit or layer of conductor may give conductivity problems with these narrow line widths.

Furthermore, whenever copper etching solutions have a tendency to pollute the environment, a process which avoids the etching of a flat copper sheet to produce a wiring pattern would be advantageous. Other problems exist, such as keeping the copper surface free of minute scratches which cause the photoresist placed on the copper sheet to define the conductor patterns for etching to be undercut by the etching solution. This may cause conductor discontinuities, etc. Similarly specks of dust can cause similar imperfections.

It is therefore an object of this invention to provide improved printed circuit boards and methods of manufacture, wherein these prior art problems are resolved.

In the parent application Ser. No. 550,379, now U.S. Pat. No. 4,528,259 of Jul. 9, 1985, the applicant disclosed a process for manufacturing printed wiring boards permitting higher circuit density, wherein a very thick solder mask photopolymer layer is photopatterned over copper traces on an insulation substrate, and metallized overall so as to deposit a layer of thick metal into through holes, onto land areas and onto the sidewalls of solder mask surrounding the printed wiring lands. The surface area of the printed wiring land is thereby increased by the order of 130 to 150 percent that of a planar land. That disclosure is incorporated herein in its entirety.

This continuation-in-part discloses a process for further increasing the density of printed wiring by extending the metallization onto the outer surface of the solder mask coating. Thus, the printed wiring traces are covered with a solder mask coating, and the associated land areas, or circuit pads, are placed on the outer surface of the solder mask, with traces running under the circuit pad. By having the traces and pads on two levels, the wiring density can be significantly increased.

In addition to increasing printed wiring density, this disclosed process has two other major objectives: an improved method for applying the board marking characters, also called nomenclature, legend, component designation and roadmapping; and an improved method for adding circuitry to the outer surface of the solder mask coating.

In the prior art, printed wiring board marking or nomenclaturing is accomplished by screen printing the characters with a pigmented epoxy to provide a visually contrasting set of characters. This screen printing step frequently results in unacceptable quality, either because of smeared characters, misregistration, or poor adherence. One major objective of this disclosure is to provide a method for marking boards photographically, to eliminate the screen printing step and thereby improve quality and reduce costs.

In U.S. Pat. No. 4,528,259 the applicant describes a method for manufacturing a printed wiring board having a solder mask insulation layer formed from a liquid photopolymer which is photopatterned using a glass plate phototransparency in pressured contact during the exposure cycle, resulting in the generation of a solder mask outer surface which is smooth, planar and free of surface irregularities. In U.S. Pat. No. 4,528,259 the flush planar surface served to keep metallization applied onto the solder mask confined to a thin planar layer which could be removed by sanding without damage to underlying printed wiring lands.

One objective is to improve on these processes by adding a layer of conductor material onto the solder mask layer and patterning the metallization so as to produce printed wiring either temporary or permanent and metallized board marking characters.

In the prior art, the SHIPLEY COMPANY advertises a proprietary method and materials for correcting board defects by adding jumper wires or conductors onto a printed wiring board. These jumper wires used to add additional permanent corrective conductors to a printed wiring board are added to the existing printed wiring board which has been solder masked and adding discrete conductors on the solder mask surface between lands by a process which includes screen printing a copper filled resin to define the desired conductor patterns, then adding solder to the jumper conductors by screen printing solder paste thereon.

This method is entirely unsuitable for incorporation into the manufacture of boards, and will not work with high density wiring patterns.

Thus, another object of this invention is to provide improved methods of adding conductors to a solder mask coating which can deal with the high resolution requirements of modern printed wiring boards.

To increase resolution as required for working with high density boards, and to produce versatility of patterns which adapt to both large and small batch production at reasonable costs, it becomes necessary to employ photo techniques, and to get very high resolutions and production control of various steps, and particularly those involving the adherance of conductors. In this respect, the use of liquid photopolymers in printed circuit wiring provides considerable advantages in cooperatively interacting with other wiring board components and interfaces.

Thus, it is a further objective of this invention to use the disclosed advantageous techniques of the parent application as critically interrelated features of the present invention. Thus, these disclosures are incorporated herein in their entireties, by reference.

The testing of the wiring on printed wiring boards is conventionally done at the end of the manufacturing process by means of a bed-of-nails fixture that probes with spring loaded contacts for circuit pad conductor connections through openings in a solder mask coating. The contactor fixture itself is a serious source of trouble and error and the reliability of conductive contact by the nails is low. It is a real problem to reliably test boards by that method.

Thus, a further objective of the invention is to provide reliable test methods for testing printed wiring boards in the manufacturing phase.

DISCLOSURE OF THE INVENTION

Thus, in accordance with this invention, a printed wiring board substrate has a photopolymer resist coating, such as a solder mask layer, adhered thereto to extend upwardly from conductor circuit pad connector positions located on the substrate surface at predetermined circuit contact positions. The polymer resist coating is a negative acting liquid photopolymer which is given a smooth flat flush surface plateau by means of a glass plate conforming the surface in the liquid form and thereafter photographically patterned to produce access channels downwardly from the surface to the board substrate to expose conductor pads. A thin conductive coating deposited on the channel sidewalls will conductively contact mated wiring pattern connector pads to expand the circuit area available for soldering, etc. A thin conductive coating layer on the flush surface is also photographically patterned to produce for temporary or permanent use a set of wiring and/or visible indicia marking nomenclature on the resist coating surface. Resulting conductor wires are connected conductively to the connector pads and typically form test wires leading to and forming a printed circuit connector format at the edge of the wiring board. Permanent indicia markers are patterned with a dot matrix or equivalent pattern to reduce capacitance electronic coupling with and between densely packed circuit wires underneath the resist coating.

External testing equipment with a matching connector is employed to test the circuit by way of its predetermined set of test wires leading to desired test points, thus avoiding a bed-of-nails fixture and assuring good electrical contact of a non-varying characteristic that can in no way damage the connector pads or miss contact therewith.

The indented channels in the resist coating serve to expand the conductive area available for conductor wires or connector pads alike by receiving conductive coatings on the channel sidewalls, thereby in the case of densely packed wiring patterns assuring good conductivity. The use of the resist coating surface for further wiring area further increases the possibility of producing higher density wiring with good adherance, conductivity and reliability.

THE PREFERRED EMBODIMENTS

Figure 1:
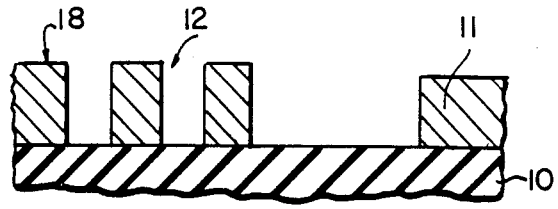
FIGS. 1 to 6 are diagrammatic sketches in section view showing a printed circuit board configuration afforded by the invention and various steps of the manufacturing process.

As shown in FIGS. 1 to 6 the flat substrate surface 18 of a printed wiring board 10 has channels 12 indented therein for receiving thin wiring ribbon conductors 17 therein on the surface of the bottom and sidewalls. Thus, the flat top portions 18 of the resulting substrate surface form insulation spacings between adjacent conductors. In this manner, adjacent closely spaced conductors are supplied with a known precise distance of insulation surface therebetween to prevent that possibility of short circuiting due to poor resolution, improper etching, etc. of conventionally prepared flat surface mounted circuits. Furthermore, with the indented circuit configuration, scratching and damage from handling is much less likely.

While the indented surfaces may be made in various ways, specific preferred processes are herein disclosed, which advantageously use the present state of the art to provide inexpensive, uncritical process steps and very dense circuit potential, realistically permitting adjacent spacing at 0.003 in. centers along the flat outer surface plane of the substrate of conductors and insulation spaces. Also, the rectangular cornered U shaped channels are not required, but are preferred to provide a maximum surface contact width of the conductor ribbons, which surprisingly enough are much wider with better adhesion and conductivity, even when placed more densely on the printed wiring boards, and take up only a very narrow conductor space on the board outer flat planar surface.

As may be seen from FIG. 1, an insulating support body 10, such as those conventionally clad on a flat insulation surface on which the wiring pattern is formed, has printed on its surface a patterned photopolymer layer 11 which forms the indented channels 12 into which the conductors will be formed as a thin surface coating, typically 0.0014 in. thick copper. The photopolymer layer is preferably about 0.006 in. thick and is patterned with high resolution phototechnology to provide the separate squared off channels and ridges, with wiring center separations defined by the channels and ridges, each of 0.003 in. width, for example.

A significant advantage of contouring the surface of the printed circuit substrate is the increase of surface area upon which the conductors may be disposed. Another is the below grade position of the conductor layer, thereby to avoid surface scratches, etc. during handling. An improvement of surface area for the conductor will come with any shape of surface in the channel. However, for maximizing surface area with conductor pattern density, deep U shaped channels are preferred. Thus, assuming 0.003 in. channel width and 0.006 in. depth the virtual conductor width for purpose of density is only 0.003 in., but the actual conductor width as placed on the bottom and side walls of the channels is close to five times that, being 0.006 in.+0.003 in.+0.006 in.=0.015 in. Even allowing for conductor thicknesses to decrease the effective width somewhat, nevertheless this invention improves the quality of the conductors as well as the circuit density.

Figure 2:
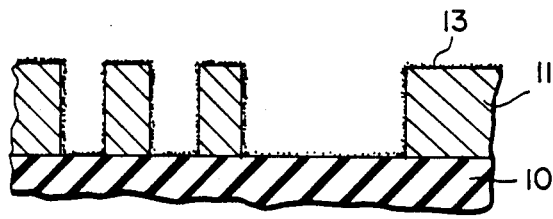

As seen in FIG. 2, a layer 13 is deposited on the contoured outer board surface, which is distinguished from the flat outer planar surface defined by the flat topped ridges 18. This is typically a catalyzing coating which permits electroless deposition of a metallic conductor layer of copper or the like, thereover as indicated at 15 in FIG. 3. In a first embodiment of this invention, the catalytic coating 13 is removed from the flat outer planar surface mechanically such as by wet sanding and then a thick electroless coating 17 is applied to provide the final circuit configuration of FIG. 6.

Figure 3:
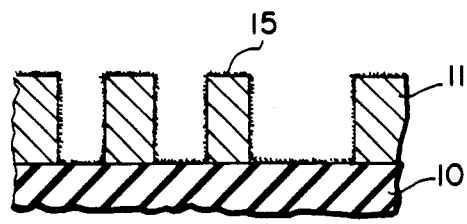
Figure 4:
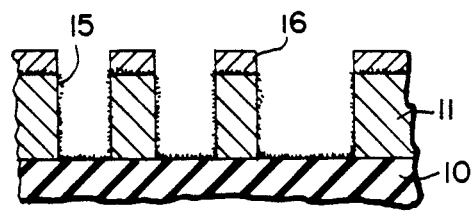
Figure 5:
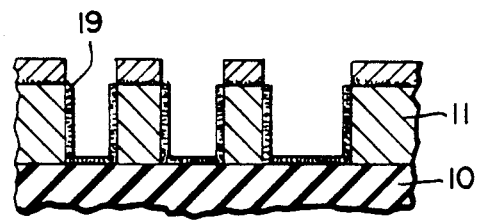
Figure 6:
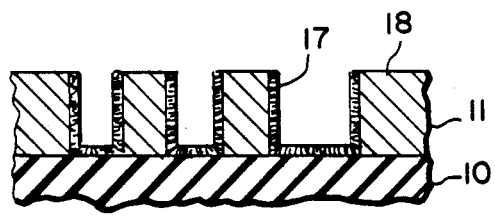

In a second embodiment, the thin electroless coating of FIG. 3 is roller coated over the top surface with a plating resist coating 16 as shown in FIG. 4. The electroless coating then serves as an electrode for electroplating a thicker layer 19 thereover, where exposed in the channels 12, thereby to produce the configuration of FIG. 5. The top flat substrate surface is then mechanically treated as by wet sanding to remove the plating resist and the electroless layer to provide the circuit pattern of FIG. 6 with the conductors disposed in the channels 12. Other metallization processes may be used, but it is particularly advantageous to avoid the chemical etching steps conventional in the manufacture of printed wiring boards. Thus, the mechanical removal of the layer(s) from the flat tops 18 of the ridges provides improved and inexpensive treatment that assures a high quality precisely spaced insulation barrier between adjacent conductors thereby virtually improving the resolution to a degree unobtainable with any photo or etching process. Realistically at this stage of the art therefore side by side parallel conductors and insulators may be provided with surface widths of 0.003 in. or less.

Figure 7:
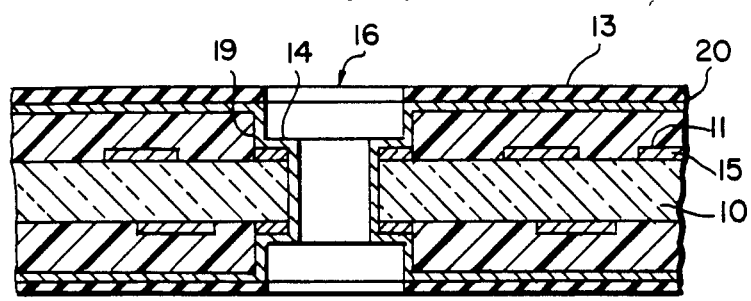
FIG. 7 is an elevation section view of a portion of a printed wiring board constructed in accordance with the teachings of this invention.

The printed wiring board configuration shown in FIG. 7 depicts a solder mask layer 11 over bare copper wiring traces 15 etched in a very thin copper cladding layer on the surface of the insulating substrate board 10. It is critical in connection land areas or circuit pads 14 such as shown about the through hole 16 that a minimum surface area be covered with a thick copper conductor, which may be soldered. In FIG. 7 it may be seen that the diameter of the eyelet 19 will dictate the spacing between circuit traces 15. It is thus inconsistent to expect higher wiring packing desnities with wiring traces located closely together when circuit pads are reliably prepared with adequate conductor surface area.

Also, it may be noted that the lands 14 are covered with a thickening layer 20 of copper, but that circuit traces 15 do not have the thickening layer 20. Heretofore the processes of wiring board construction have included a thickening layer of copper on all the circuit wiring traces on the substrate 10 before the solder mask layer 11 is applied.

Now in accordance with this invention an improved wiring board is provided with more dense wiring, less copper and high quality large area circuit pad connections, surprisingly requiring fewer manufacturing steps. It is possible with the process of this invention to eliminate some critical chemical manufacturing steps before required to the effect that expensive pollution control procedures are no longer necessary.

Those steps taken in sequence to make this improved wiring board are outlined as follows:

(1) drill the through holes 16 in the substrate laminate 10, which is clad with a very thin layer of copper to facilitate the etching of the circuit traces therein;

(2) laying down an etch resist layer on the copper cladding to define the desired circuit trace pattern, etching away unwanted copper and stripping the etch resist layer;

(3) laying down a liquid photopolymer solder mask layer with a smooth flat planar outer surface over the etched circuit traces, photoexposing to provide a pattern for leaving exposed land areas 14, etc. to be prepared as circuit connection pads, and developing to remove the photopolymer about the circuit lands 14, etc. in such a way to leave substantially cylindrical shaped solder mask walls with a somewhat roughened texture to which a layer of copper will adhere well;

(4) chemically depositing by the electroless process a thin layer of copper, typically 0.00005 in. (0.00013 cm) thick, over the solder mask surface and into the exposed land positions and on the substrate therearound and through the holes in the laminate;

(5) rolling or screening over the electroless copper layer resident on the flat planar glossy solder mask outer surface an insulating resist layer 13;

(6) electroplating a thick layer, typically 0.001 inch (0.0025 cm), of copper; and (7) mechanically removing the resist layer 13 with the underlying thin copper layer 20 from the glossy surface of the solder mask layer 11 by stripping, air or water jet, etc.

The preferred liquid photopolymer for the solder mask coating is type 311LV manufactured by M&T Chemicals of Rahway, N.J. The coating thickness is at least 0.002 inch (0.005 cm) over traces and 0.004 inch (0.01 cm) over the base laminate. A preferred method of processing the solder mask layer is to deposit it in two separate coatings. The first coating can be screen printed with an appropriate gauge mesh polyester screen without a stencil to a thickness of 0.002 inch (0.005 cm) directly over the substrate 10 with the wire traces 15 thereon. A further layer of the same thickness is coated on a flat photoimage plate of glass or plastic carrying an appropriate image for the solder mask pattern over the circuit traces. The two liquid photopolymer coatings are then brought together in air free contact so that the flat plate will further enhance the glossy outer surface to make a poor adherance surface for the electroless thin copper layer to be deposited thereon. This can be done by placing the layers in a vacuum chamber at decreased pressure of 25 inches (62.5 cm) of mercury thereby to purge all air from between the two coated surfaces before they are joined. Alternatively, where a thin layer of photopolymer can be used, as would be the case with thin copper conductors, then the liquid photopolymer can be applied to either the substrate 10 or the flat photoimage plate, but not necessarily both. The photo exposure step may take place either within or outside the vacuum chamber. The exposed photopolymer is developed by washing out unhardened areas with a solvent mixture of 85 parts trichloroethane and 15 parts isopropyl alcohol.

Metallization layer 20 is applied over the photopolymer surface after development using the M&T HD high speed autocatalytic copper plating process of M&T Chemicals. The deposition thickness is just enough to provide a conductive path for the electroplating step.

Plating resist layer 13 may be roller coated because the solder mask surface is flat and free of any projections or irregularities. A preferable resist is type CNF 1110 from M&T Chemicals.

Copper is conventionally electroplated on the exposed land areas to a thickness of the order of 0.001 inch (0.0025 cm). Note that this invention now provides for the plating of the substantially cylindrical side walls of the solder mask layer 11 thereby to substantially increase the available conductor area to which contact can be made. This permits the diameter of the eyelet 19 to be made smaller without reducing the reliability of the circuit pad connection.

Tin-lead is then electroplated over the thickened copper coating, after which the plating resist layer 13 is removed along with the underlying electroless deposited thin copper layer. Because of the glossy polymer surface the resist may be removed mechanically to avoid chemical processes and their corresponding pollutant atmospheres which must be confined or eliminated. Preferably this is done by air abrasion or by light sanding. It may also be done by an air or water stream. The electroless deposit about the land areas and through holes, however, makes a strong bond because the solder mask and substrate surfaces are textured by the earlier process steps. Thus, the desired metallized areas are not removed by this mechanical removal step.

The typical increase in land surface area has a typical 0.050 inch (0.125 cm) diameter eyelet 19 surface area increased at least 20 percent by metallizing the surrounding annular ring. In addition, the metallization of the vertical wall surfaces of the solder mask layer, the land surface area is increased by 130 percent.

This process afforded by this invention thus eliminates several steps and reduces the expenditure of materials, while retaining the significant advantages of the solder mask over the bare wire type of printed wiring board. Accordingly, the conventional practice of plating tin-lead over all conductor traces before applying the solder mask coating is eliminated, together with the requisite chemical etching and stripping and it polluting side effects. Furthermore, immersion in molten solder with corresponding expensive equipment and hot air knives for blowing away excess solder are eliminated.

Additional advantages are provided by saving of materials where copper and tin-lead coatings are only required on the desired circuit pad locations. Fusing of the tin-lead layer is simply achieved with inexpensive equipment.

The ability to resolve fine lines and spaces is of great importance. One of the limitations to achieving fine lines and spaces of the order of 0.005 inch (0.0127 cm) is the primary imaging step, which is the photopatterning of either a plating or etch resist. An etch resist photopolymer is typically one fourth of the thickness of a plating resist photopolymer, and since the resolution decreases with the photopolymer thickness, greater resolution can be achieved with an etch resist pattern. The disclosed process defines conductor patterns by etching prior to electroplating and thereby achieves improved resolution. This departs from the prior art practice for solder mask on bare copper printed wiring boards where resolution is sacrificed by employment of a plating resist for the primary imaging.

For the higher resolution advantage afforded by this invention, the primary imaging of the conductor patterns is achieved by the steps now described. A flat (preferably glass) plate phototool with clear areas defining the conductor locations has a photopolymer release coating on the image plane over which a layer of the CNF 1110 photoresist is applied by screen printing over the entire plate surface.

The photopolymer layer is partially hardened in light struck areas by passing light through the glass plate into the photoresist layer. This step hardens the photopolymer layer enough so that its viscosity precludes extrusion of photopolymer from between the phototool and the printed wiring board. Next the glass plate is placed with the photopolymer layer near to and out of contact with the copper clad and previously drilled printed wiring board substrate, in a vacuum chamber for contact to be made in the presence of a pressure of about 30 inches (75 cm) of mercury.

Then the photopolymer is fully hardened by exposure to light passing through the glass plate and thereby clings to the printed wiring board. The release layer of the glass plate permits its removal for recoating and reuse with screening directly over the unhardened photoresist thereon.

Mentioned heretofore was the achievement of increased land surface area. One additional desirable feature of the lands is the increase in copper thickness on land areas, while the traces require no additional electroplated copper. Thus, a heavy copper interconnection layer is provided without waste of copper.

New functions are achieved by this invention in addition to the traditional functions. The flush solder mask provides for restricting solder to land areas for wave soldering with life long insulation and environment protection. Furthermore, the flush solder mask characteristic permits temporary metallization (from which used copper is reclaimable) mechanically removable with improved cost and environmental advantages.

Prior art solder mask coatings produce a surface which roughly follows the contours of the conductor patterns and is therefore not flush nor flat so that mechanical removal of a layer could not be achieved. If a solder mask is screen printed, mesh marks result and any metallization thereover would need be etched for removal. Smooth surfaced layers cannot be achieved by simply roller coating over a contoured surface, and the substitute photo imaging step would be more costly and time consuming.

A distinctive and novel feature of the printed wiring board afforded by this invention is the flat flush solder mask outer surface, which permits the electroless deposition step and corresponding simplification of the manufacturing process. Plating of the sidewalls of the solder mask layer is also a distinctive feature of this invention.

The disclosed method for solder masking of printed wiring boards is not restricted to solder mask over bare copper boards but can be used independently to achieve a solder mask coating over circuit traces covered with tin-lead or other metal.

The aforedescribed photoresist placed on the metallization layer preferably is positive acting, meaning that the light-struck photoresist is rendered soluble in a developer solution. This characteristic enables the resist to be photopatterned several times, so as to form different metallization patterns with each photopatterning step. The photoresist is preferably applied by roller-coater and dried and is then used as a plating resist to confine electroplated metal to areas recessed below the planar outer surface. After electroplating, the photoresist is patterned and the uncovered metallization is etched to produce the useful metallized patterns.

Figure 8:
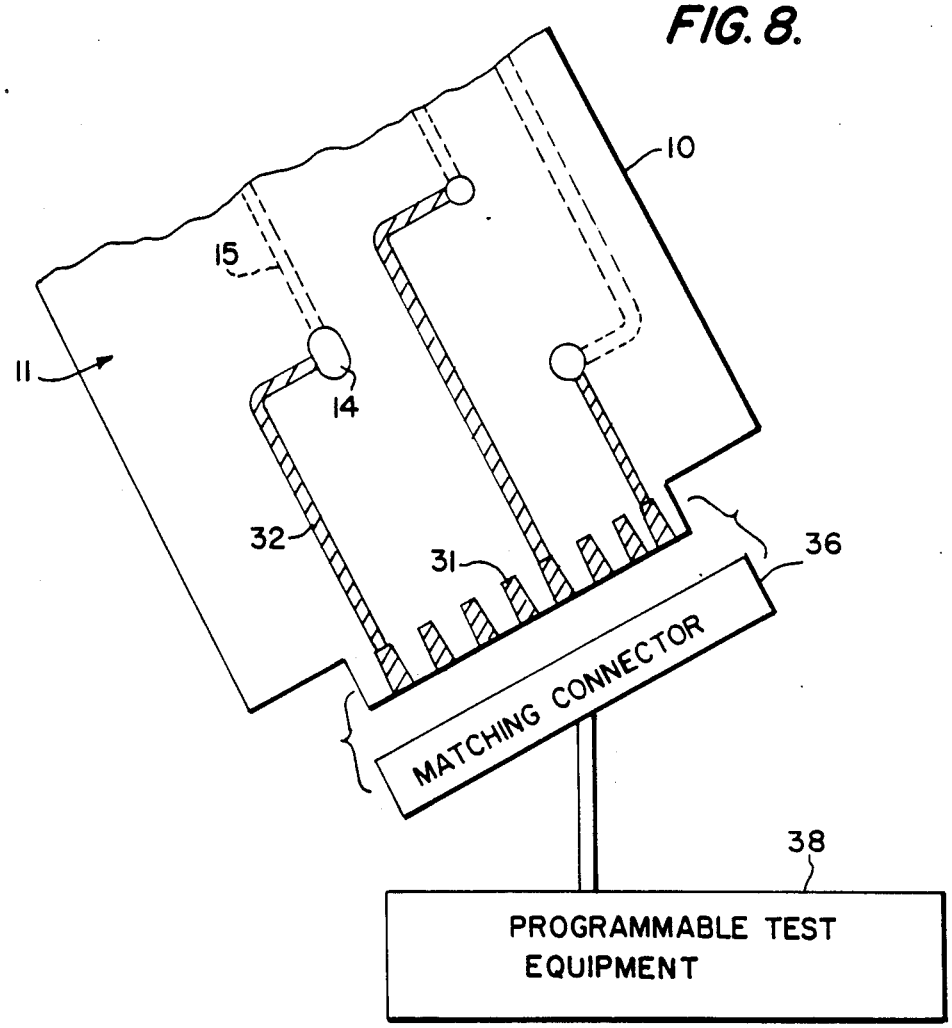
FIG. 8 is a fragmentary sketch, in perspective of a printed wiring board ready for testing during the manufacturing phase.

In this embodiment as shown in FIG. 8, the etched patterns constitute a set of temporary conductors and temporary contact pads useful in the electrical testing of the underlying printed wiring. Thus, the temporary conductors obviate the need for the traditional bed-of-nails contact probe arrays which uses spring-loaded contact probes to make contact with those lands selected as test points. With the temporary wiring and temporary contact pads in place near the board periphery then a standard connector 38 can be used to test many different board types without the need for the bed-of-nails fixtures. After electrical tests are completed, the temporary conductors and contact pads may be removed by sanding or by chemical means without adverse effect on the underlying printed wiring. It is important that the temporary wiring be removed, otherwise the added capacitance would adversely affect the electrical performance by electronic coupling between wires in the circuit board wiring pattern, and would result in degraded high frequency response.

The printed wiring board carrying the temporary conductors as just described significantly speeds up the testing process and provides production economies, by eliminating the fixture set-up time, and by enabling intermixed board types to be tested, as contrasted to the practice in the current art of testing in a batch mode.

Figure 9:
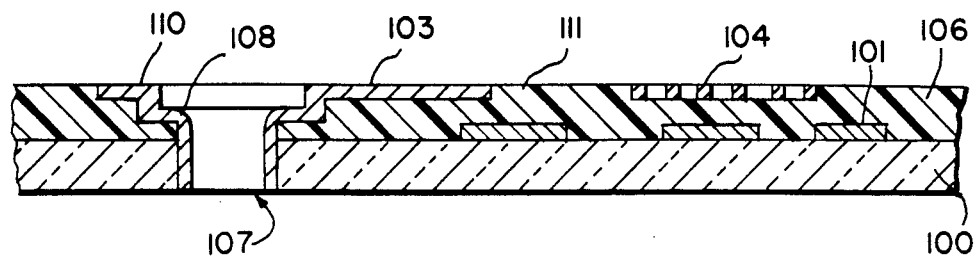
FIGS. 9 and 10 are respectively section and top views of a circuit wiring board embodiment of the invention showing printed wiring on a photopolymer insulating resist layer covering the wiring pattern on a substrate surface of the board.
Figure 10:
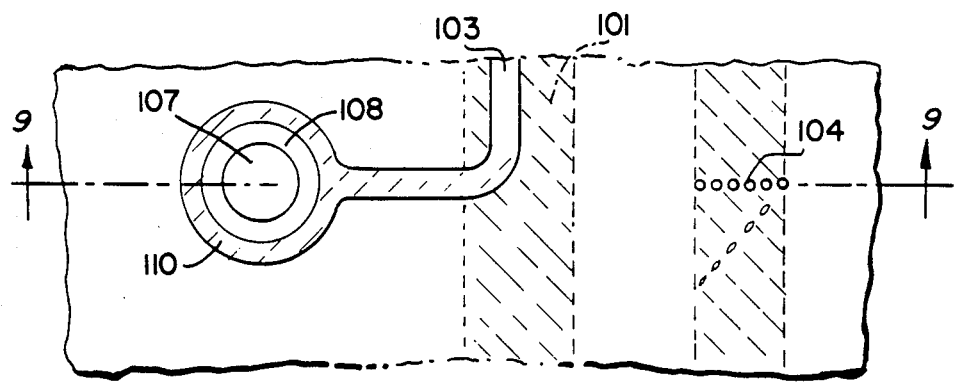

A further embodiment of this invention as shown in FIGS. 9 and 10 is the formation of permanent board marking characters on the solder mask layer by forming the characters from the metallization layer previously described. The photoresist is photopatterned to expose the metallization, which may then receive electroplated metal to incarease its thickness and improve its etch resist properties. By placing marking characters on the solder mask layer as just described, advantages over current art practices can be realized. First, current art screen printing processes cannot match the printing resolution which can be obtained by photopatterning the positive-acting photoresist as described herein. Secondly, current art practices of metallizing marking characters alongside the printed wiring restricts the size and placement, for the characters must not bridge adjacent circuits and thereby cause shorts. This instant process permits metallized marking characters to cover much more area as only the land areas cannot be used for marking characters.

Referring to FIG. 8, base laminate 10 has permanent wiring 15 shown in dotted outline to denote that the solder mask layer 11 is placed thereover. Temporary conductors 32 are electrically connected to lands 14 and to connector contact pads 31, which are located on the edges of the board substrate. Metallization extends from land 14 along the solder mask sidewall 19 and through temporary conductor 32 so as to form a contiguous metal layer conductor from land 14 to temporary contact pad 31. A printed wiring board is made in accordance with the preferred embodiment as follows:

A copper-clad insulation substrate 10 is drilled, photopatterned with an etch resist, and etched to produce the permanent printed wiring 15. A thick solder mask layer 11 is formed from a liquid photopolymer, using a liquid photopolymer layer of the order of 0.006 inches (0.015 cm) in pressured contact between a glass plate phototool and the printed wiring board 10, then exposed to harden wanted photopolymer to form the solder mask 19. Unexposed photopolymer is removed in a developer solution to expose the conductor pads 14 on the substrate surface. The solder mask surface thus has a smooth flush plateau free of surface irregularities which would detract from the quality of the completed board. Next, a metallization layer, preferably copper is deposited on all surfaces contacted by the plating solution, using known materials in use in printed wiring manufacture. A layer of photoresist, preferably a positive-acting type is applied to the metallization layer that is resident on the flush outer surface. The SHIPLEY COMPANY makes a positive-acting photoresist which is suitable; the type PHOTOPOSIT 1195, and this resist can be applied by roller coater, a step made feasible by the flush smooth metallization surface. After drying the photoresist and electroplating additional metal onto exposed metal surfaces, the resist layer 11 is photopatterned so as to define temporary conductors 12 and temporary contact pads 31, and metallization not covered with resist is then etched away. After etching, one final photopatterning step is made to remove the photoresist from contact pads 31, to facilitate contact with a mating connector during electrical tests. The photoresist is left on temporary conductors 32 to provide electrical insulation. After electrical tests are completed on printed wiring 15, and when the temporary wiring 32 and contact pads 31 are no longer needed, these can be removed by sanding or they can be removed chemically by etching, thereby leaving the printed wiring 15 not adversely affected.

In order to place the advantages of this preferred embodiment in proper perspective, a brief description of current art printed wiring testing methods is now described.

Bare board tests are performed to verify electrical continuity of printed wiring and to detect any short circuits. When testing a large computer-grade printed wiring board, there are typically 1000 to 4000 test points (printed wiring lands) which are contacted by spring-loaded contact probes, and computer-generated signals are fed to and from the PWB via these probes. Thus, a signal is fed to one test point while the remaining test points are checked for the proper signal, and the next test point is then sampled until all test points are tested.

In the current art, the computerized test equipment 35 is connected by a standard connector 36, and this standard connector in turn connects to the bed-of-nails fixtures. A dedicated fixture is required for each type of PWB to be tested, and this requirement limits electrical testing to only large production runs, otherwise the cost per tested board becomes prohibitive.

This invention eliminates the need for the contact probe fixture, for each PWB has its own equivalent functions built into the temporary conductors and contact pads 31 which match the standard connector 36 at very small expenditure of resources. Thus, it is made practical and economical to electrically test smaller quantities of boards, and it is much easier to accommodate revisions to printed wiring 15; a difficult and expensive process using bed-of-nails fixtures.

For developing the disclosed method for photographically forming the test conductor the applicant tested a lower resolution process wherein the test conductors were formed by screen printing a silver-filled liquid polymer in the conductor pattern so as to make electrical contact with those lands selected as test points. While this screen printing process is viable for low density printed wiring covered by a thin solder mask coating it is not the preferred embodiment.

Earlier, it was stated that there are other applications where the disclosed process can be used to form metallization patterns on the solder mask layer which need not be test conductors, but which may be board marking characters that form a permanent part of the completed board. This application is a significant improvement over current art marking processes using screen printing. Screen printed marking characters are limited in resolution by the liquid epoxy ink being printed and by the mesh marks usually present in solder masks formed by screen printing. These mesh marks serve to wick the marking epoxy beyond the desired patterns, causing a serious loss of character fidelity. Marking characters formed in accordance with this instant process have extreme fidelity, since they are formed photographically. Further, by placing the characters on the solder mask layer, the characters may be metallized for permanency without reducing the space available for printed wiring. Also, they may be made in a standard manufacturing step without special processing. One added advantage of this instant board marking process is that a skilled craftsman is not required, as is the case for screen printed character formation.

In the embodiment of FIGS. 9 and 10, the nomenclature characters 104, any permanent wires 103, and expanded solder pad surfaces 110 are formed on the surface of the solder mask photopolymer at the same time that the solder mask coating is photopatterned. The nomenclature characters are formed as depressions in the solder mask layer from the flat flush plateau 111 to a depth of the order of 0.001 inch (0.0025 cm), but not extending to a depth that would expose the underlying conductor traces.

The electroless metallization step metallizes the depressions as well as all other exposed surfaces. A plating resist is next coated over the electroless metallization to restrict electroplating additional metallization to those desired areas. The plating resist may leave the nomenclature characters uncovered, so that additional metallization is electroplated thereover. When the plating resist and flush metallization is removed by sanding, the nomenclature characters are readily visible.

To preclude the possibility of short circuits between the underlying conductors and the nomenclature characters and to reduce capacitance coupling, the nomenclature characters are formed of dot patterns that provide legibility but not unwanted electronic coupling.

The formation of jumper wires 103 is accomplished similarly except that the jumper wires are formed as depressions in the solder mask photopolymer caused by raised transparent patterns on the phototool carrying the solder mask images.

In a similar manner, metallization is added to the outer solder mask surface to form printed wiring lands 118, so as to place the traces 101 and lands 110 on different planes, wherein the traces can run underneath a land, or circuit pad as frequently called. The printed wiring density is thereby improved significantly. For example, a printed wiring board having conductors and spaces of 0.008 inches (0.02 cm) may typically have a 0.030 diameter drilled hole surrounded by a land of 0.050 inches diameter. Conductor traces must therefore be diverted around the land and adjacent traces are therefore 0.074 inches apart, center to center. By placing the land on a higher plane the separation distance between adjacent conductor traces diverging around the 0.030 diameter drilled hole is reduced to 0.054 inches center to center spacing.

A phototransparency is prepared which will be used to photopattern solder mask layer 106. The phototransparency contains opaque areas corresponding to land areas 108 or other areas where the insulation substrate 100 and traces 101 will be free of hardened solder mask. Additionally, the phototransparency has opaque areas 104 where marking characters will be delineated as depressions on the surface of the solder mask, but not extending to a depth so as to uncover underlying trace 101. In addition to the opaque patterns on the phototransparency, raised patterns of a transparent resin are added at locations where depressions are desired in the hardened solder mask photopolymer, but a thorough cure down to base laminate 100 is also desired, for example, jumper wire 103 would be represented as a raised line on the phototransparency.

The marking character 104 is preferably formed by a series of dots not having electrical continuity so as to guard against the possibility that a short circuit may be inadvertently produced by the marking character touching circuit trace 101. Alternatively, the marking characters can be formed at connected lines, and these lines would be represented on the phototransparency as the aforementioned raised transparent patterns, so that photopolymer thereunder can be hardened by light passing through the transparent raised patterns.

These dots are small, such as produced by a dot matrix printer, or produced on the phototransparency by known half-tone printing techniques. The dot size is selected so that non collimated light will undercut the opaque dots on the phototransparency and will produce an area of unexposed photopolymer to a depth of the order of 0.001 inch (0.0025 cm), but not beyond. The surface of the solder mask is thus textured but the depressions do not necessarily extend to a depth which would uncover an underlying trace 101.

The aforedescribed process for forming depressions in the liquid photopolymer by phototransparency raised patterns is used when the metallization layer 20 is to be mechanically removed. When metallization layer 20 is to be removed by chemical etching then the lands 110 and marking characters 104 can be formed on surface 111.

Accordingly, this invention provides novel printed wiring board structure and methods of manufacture, which advance the state of the art. Increased efficiency of circuit space usage with given board substrate dimensions thus permits additional circuit board patterns to be printed without increasing the substrate area. This is achieved by conductively plating the sidewalls of access channels, and indentations downwardly extending into the solder mask coating surface and by disposing a layer of conductive material on the surface of the solder mask coating in a pattern with controlled electronic coupling to the circuit board wiring pattern. That is predetermined conductive coupling either temporary or permanent wiring patterns on the solder mask coatings is effected and unwanted capacitive coupling is reduced for permanent wiring left on the solder mask coating. Typically dot matrix patterns are used for indicia marking nomenclature.

Particular advantages are achieved by a smooth glossy flush flat solder mask surface plateau, from which temporary wiring may be readily removed mechanically by sanding and the like and to which processing conductive and resist layers may be overlaid by roller coating.

For the first time in the art temporary test patterns are formed on the solder mask layer of a printed circuit board for elimination of bed-of-nails type testing fixtures, and permitting testing as an integral part of a board production process with standardized edge connector structure for coupling to test equipment.

Having therefore advanced the state of the art, those novel features believed representative of the spirit and nature of the invention are defined with particularity in the following claims.

I claim:

1. In a printed wiring board assembly having an insulation photopolymer resist coating such as a solder mask layer disposed to extend upwardly from a conductive circuit wiring pattern on a printed wiring board substrate surface to cover a substantial portion of the substrate surface while leaving exposed through a resist coating conductor pads at predetermined circuit contact positions on the substrate surface, the improvement comprising in combination providing increased efficiency of circuit space usage with given board substrate dimensions thereby permitting additional circuit board patterns to be printed without increasing the substrate area, namely, a thin conductive circuit pattern on the substrate surface, said insulation resist coating consisting of a cured liquid photopolymer with a glossy flush surface formed by contact of a flat plate with the polymer in liquid form which is adhered to the substrate surface and presents a flush flat surface plateau with access channels downwardly extending thereinto to expose the conductor pads on the substrate surface and having a thin conductive coating on the channel sidewalls electrically contacting the exposed conductor pads, and a layer of conductive material disposed on the surface of said insulation coating in a pattern with controlled electronic coupling to the circuit board wiring pattern.

2. The assembly defined in claim 1 wherein the layer of conductive material comprises indicia marking nomenclature.

3. The assembly defined in claim 2 wherein the indicia marking nomenclature comprises dot matrix patterns thereby reducing capacitance coupling to conductor wires in said wiring pattern.

4. The assembly defined in claim 1 wherein the layer of conductive material comprises a conductive wiring pattern electrically connected to at least one of the circuit contact positions by means of said coating on the sidewalls.

5. The assembly of claim 4 wherein said pattern comprises an enlarged pad conductor surface area disposed in part on the insulation resist coating surface.

6. The assembly of claim 4 wherein said pattern comprises a set of test connector leads electrically connected to at least a portion of the circuit pad positions and leading to and forming connector terminals at the edge of the printed wiring board substrate.

7. The assembly of claim 4 including portions of the conductive material pattern disposed as indicia on said flat surface and electrically insulated from said wiring pattern.

8. The assembly of claim 7 wherein the indicia pattern is comprised of half tone dot patterns thereby serving to reduce capacitance coupling with circuit wiring patterns on the printed wiring board substrate.

9. The assembly defined in claim 1 wherein the wiring pattern is disposed in part on the insulation coating.

10. The assembly defined in claim 1 wherein the conductive circuit pattern coating on the surface of the substrate is covered in part by the resist insulation coating.

11. The assembly defined in claim 1 wherein a supplemental circuit wiring pattern electrically connected to the wiring pattern on the substrate surface is disposed in part on the surface of the insulation coating.

12. The assembly defined in claim 11 further comprising said resist coating disposed with a plurality of side by side surface portions, namely ridges on said substrate surface and spacings therebetween with the tops of the ridges defining a flat surface, conductor lines deposited in the spaces over the exposed surfaces therein to produce lines of a width greater than the distance between the ridges, and insulators between the spaces comprising the flat topped surfaces of the ridges processed to remove any residual conductors thereon.

13. The printed wiring board defined in claim 12 wherein the flat substrate surface and indented surfaces of the channels formed between said ridges is metallized over the channel surface area to define the conductors wider than the spacing between the ridges.

14. The printed wiring board defined in claim 12 with substantially U shaped channels metallized on the bottom and sidewalls thereby providing a substantially greater width of the conductor than would be disposed on a flat surface of the substrate in the same place.

15. The printed wiring board defined in claim 14 having a channel depth of about 0.006 in., a channel width of about 0.003 in., and a spacing between channels of about 0.003 in.

16. The printed wiring board of claim 15 with the metallized surface defining the conductor having a thickness of about 0.0014 in.

17. The printed wiring board of claim 14 with said ridges comprising a photopolymer material extending above a substantially flat insulating surface of a supporting body.

18. A printed wiring board assembly, comprising in combination, a solder mask layer disposed to partially cover a conductive circuit wiring pattern on a printed wiring board substrate, and a layer of conductive material visibly disposed to permanently adhere onto the outer surface of said solder mask layer comprising an indicia marking nomenclature pattern overlying a plurality of circuit wires on said wiring pattern produced by a dot matrix pattern of conductive material breaking up the indicia pattern area to reduce capacitive coupling between the conductor wires in said wiring pattern which are overlaid by the indicia pattern.

19. The method of producing a printed wiring board assembly having an insulation resist coating such as a solder mask layer disposed to extend upwardly from a conductive circuit wiring pattern on the printed wiring board substrate surface leaving exposed conductor pads at predetermined circuit contact positions on the substrate surface, comprising the steps of: improving efficiency of circuit space usage with given board substrate dimensions thereby permitting additional circuit board patterns to be printed without increasing the substrate area by providing on the substrate surface a thin conductive circuit pattern, adhering to the substrate surface and insulation resist coating presenting a flush flat surface plateau with access channels downwardly extending thereinto the substrate surface, coating channel sidewalls with a thin conductive coating electrically contacting the exposed conductor pads, disposing on the surface of said insulation coating a layer of conductive material as indicia marking nomenclature in a pattern electronically coupled to the circuit board wiring pattern on the substrate surface, and disposing the conductive material in said indicia pattern in a dot matrix pattern to reduce capacitance coupling between conductor wires in said wiring pattern on the substrate surface.

20. The method of producing a printed wiring board assembly having an insulation resist coating such as a solder mask layer disposed to extend upwardly from a conductive circuit wiring pattern on the printed wiring board substrate surface leaving exposed conductor pads at predetermined circuit contact positions on the substrate surface, comprising the steps of: improving efficiency of circuit space usage with given board substrate dimensions thereby permitting additional circuit board patterns to be printed without increasing the substrate area by providing on the substrate surface a thin conductive circuit pattern, adhering to the substrate surface an insulation resist coating presenting a flush flat surface plateau with access channels downwardly extending thereinto exposing conductor pads in the conductive circuit pattern on the substrate surface, coating channel sidewalls with a thin conductive coating electrically contacting the exposed conductor pads, disposing on the surface of said insulation coating a layer of conductive material as indicia marking nomenclature in a pattern electronically coupled to the circuit board wiring pattern on the substrate surface, and photoprinting a layer of liquid photopolymer overlying the printed wiring on said board to produce a permanently adhered said resist coating.

21. The method of claim 20 including the step of electrically connecting the layer of conductive material disposed on the surface of the insulation coating to the wiring pattern by means of said coating on the sidewalls.

22. The method of claim 21 including the step of forming in said pattern disposed on the surface of the insulation coating a contiguous enlarged pad conductor surface area in part disposed on the insulation resist coating surface.

23. The method of claim 20 including the step of forming in said pattern disposed on the surface of the insulation coating a set of test connector leads electrically connected to at least a portion of the circuit pad positions and leading to and forming connector terminals at the edge of the printed wiring board substrate.

24. The method of claim 23 including the steps of testing the printed wiring board by means of test equipment coupled to said connector terminals, and removing the set of connector test leads from the surface of the insulation coating after testing.

25. The method of claim 20 including the step of depositing the layer of conductive material on the flat flush plateau surface of the insulation coating.

26. The method of claim 25 including the steps of temporarily using the conductive pattern on the insulation coating surface for processing the manufacture and testing of the printed wiring board and removing that conductive pattern from the plateau surface.

27. The method of claim 20 including the step of covering in part the circuit pattern coating on the surface of the substrate with the resist coating surface.

28. The method of claim 20 including the steps of indenting the plateau surface of the resist insulation coating in a predetermined pattern, and disposing at least in part said pattern of conductive material disposed on the surface of the insulation coating in the indented pattern.

29. The method of claim 20 including the step of photoprinting said resist coating to overly portions of a printed wiring pattern on said board.

30. The method of claim 20 including the steps of photoprinting said resist coating with channels extending between the surface plateau and the substrate surface, and coating the substrate surface and channel sidewalls with a thin conductive layer to constitute at least a portion of the printed wiring pattern on said board.

31. The method of producing a printed wiring board assembly having an insulation resist coating such as a solder mask layer disposed to extend upwardly from a conductive circuit wiring pattern on the printed wiring board substrate surface leaving exposed conductor pads at predetermined circuit contact positions on the substrate surface, comprising the steps of: improving efficiency of circuit space usage with given board substrate dimensions thereby permiting additional circuit board patterns to be printed without increasing the substrate area by providing on the substrate surface a thin conductive circuit pattern, adhering to the substrate surface an insulation resist coating presenting a flush flat surface plateau with access channels downwardly extending thereinto exposing conductor pads in the conductive circuit pattern on the subtrate surface, coating channel sidewalls with a thin conductive coating electrically contacting the exposed conductor pads, disposing on the surface of said insulation coating a layer of conductive material as indicia marking nomenclature in a pattern electronically coupled to the circuit board wiring pattern on the substrate surface, and providing at least one temporary conductive path on said insulation surface plateau with electrical connection to the circuit wiring pattern, conducting electrical current through said temporary conductive path to said circuit wiring pattern in a manufacturing step, and removing the temporary conductive path from the plateau following completion of said manufacturing step.

32. The method defined in claim 31 further including the manufacturing step of electro depositing conductive material on circuit wires in the wiring pattern by means of said electrical current.

33. The method defined in claim 31 further including the manufacturing step of passing electrical test signals to the circuit wiring pattern with said electrical current.

34. The method of claim 33 comprising the further step of producing an intermediate product, namely, a printed wiring board assembly having a test wiring pattern positioned on said plateau connected to predetermined test point in the circuit wiring pattern.

35. The method of manufacturing printed wiring boards comprising the steps of:
  providing an insulation layer over a significant portion of a printed wiring pattern on a printed wiring board leaving exposed predetermined wiring positions and presenting an outer flush plateau surface to which a conductor material may be removably affixed,
  providing at least one temporary conductive path affixed on said surface electrically connecting the temporary conductive path with a predetermined conductive position on the printed wiring pattern,
  conducting electrical current through said temporary conductive path to said wiring pattern in a manufacturing step, and
  removing the temporary conductive path from said surface following completion of said manufacturing step.

36. The method of claim 35 further including the step of electro depositing conductive material on the wiring positions in the wiring pattern exposed through the insulation layer with said electrical current.

37. The method of claim 35 including the step of passing electrical test signals to the circuit wiring pattern with said electrical current.

* * * * *